United States Patent
Song et al.

(10) Patent No.: US 7,952,438 B2
(45) Date of Patent: May 31, 2011

(54) INJECTION LOCKING CLOCK GENERATOR AND CLOCK SYNCHRONIZATION CIRCUIT USING THE SAME

(75) Inventors: Taek-Sang Song, Kyoungki-do (KR); Kyung-Hoon Kim, Kyoungki-do (KR); Dae-Han Kwon, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 247 days.

(21) Appl. No.: 12/217,049

(22) Filed: Jun. 30, 2008

(65) Prior Publication Data

US 2009/0167441 A1    Jul. 2, 2009

(30) Foreign Application Priority Data

Dec. 26, 2007   (KR) .................. 10-2007-0138023

(51) Int. Cl.
    *H03B 27/01*      (2006.01)
(52) U.S. Cl. .................. 331/51; 331/2; 331/48; 331/46; 331/47; 331/55; 331/57; 331/34; 331/177 R; 327/156; 327/157
(58) Field of Classification Search .................. 331/57, 331/16, 34, 177 R, 2, 46, 47, 48, 55; 327/156, 327/159
See application file for complete search history.

(56) References Cited

U.S. PATENT DOCUMENTS

| | | | |
|---|---|---|---|
| 6,411,669 B1 * | 6/2002 | Kim | 377/48 |
| 7,348,818 B2 * | 3/2008 | Hulfachor et al. | 327/156 |
| 2006/0267644 A1 | 11/2006 | Youssoufian et al. | |

FOREIGN PATENT DOCUMENTS

| | | |
|---|---|---|
| JP | 04-260385 A | 9/1992 |
| KR | 10-2004-0072083 A | 8/2004 |
| KR | 10-2005-0105558 A | 11/2005 |

* cited by examiner

*Primary Examiner* — Arnold Kinkead
(74) *Attorney, Agent, or Firm* — Blakely Sokoloff Taylor & Zafman

(57) ABSTRACT

An injection locking clock generator can vary the free running frequency of an injection locking oscillator to broaden an operating frequency range of an oscillation signal injected to itself, thereby performing an injection locking with respect to all frequencies of an operating frequency range. The clock generator includes a main oscillator configured to generate oscillation signals of a frequency corresponding to a control voltage, and an injection locking oscillator configured to generate division signals synchronized with the oscillation signals by dividing the oscillation signals, wherein a free running frequency of the injection locking oscillator is set according to the frequency of the oscillation signals.

9 Claims, 5 Drawing Sheets

INJECTION LOCKING CLOCK GENERATOR AND CLOCK SYNCHRONIZATION CIRCUIT USING THE SAME

CROSS-REFERENCE(S) TO RELATED APPLICATIONS

The present invention claims priority of Korean patent application number 10-2007-0138023, filed on Dec. 26, 2007, which is incorporated by reference in its entirety.

BACKGROUND OF THE INVENTION

The present invention relates to a semiconductor design technology, and more particularly to a clock generator using an injection locking scheme and a clock synchronization circuit using the same.

Generally, a semiconductor memory device including a double data rate synchronous dynamic random access memory (DDR SDRAM) receives an external clock signal to generate an internal clock signal, and uses the internal clock signal as a reference for adjusting various operation timings in the semiconductor memory device. Therefore, a clock synchronization circuit must be included in the semiconductor memory device in order to generate the internal clock signal synchronized with the external clock signal. Representative examples of such a clock synchronization circuit include a phase locked loop (PLL) and a delay locked loop (DLL).

The PLL and the DLL have similar configurations. However, the PLL employs a voltage controlled oscillator (VCO) to generate the internal clock signal, whereas the DLL uses a voltage controlled delay line (VCDL). The VCO and the VCDL may be divided into an analog method and a digital method in accordance with a control scheme.

In the field of a semiconductor memory device, various researches have been conducted to increase operating speed, reduce power consumption and remove jitters mixed in an external clock signal.

A part of such researches is adopting an injection locking scheme. The injection locking scheme is a method that an oscillation signal output from a master oscillator is injected into a slave oscillator in order to synchronize an oscillation signal output from the slave oscillator with the oscillation signal output from the master oscillator. A circuit designed in this manner can reduce power consumption and improve operation performance with respect to the jitters. The injection locking scheme will be described in more detail with reference to FIG. 1.

FIG. 1 is a block diagram of a clock generator using a general injection locking scheme.

Referring to FIG. 1, the clock generator using the general injection locking scheme includes a main oscillator 110 serving as a master oscillator, and an injection locking oscillator 130 serving as a slave oscillator.

The main oscillator 110 generates a positive main oscillation signal M_OSC having a frequency corresponding to the voltage level of an input control voltage V_CTR and a negative main oscillation signal M_OSCB having a phase opposite to that of the positive main oscillation signal M_OSC. The main oscillator 110 may have a minimum frequency and a maximum frequency according to the voltage level of the control voltage V_CTR. Hereinafter, such a frequency range will be referred to as the operating frequency range of the main oscillator 110.

The injection locking oscillator 130 is implemented as a ring oscillator including a first delay cell 132 and a second delay cell 134. The first delay cell 132 receives a positive final oscillation signal FIN_OSC and a negative final oscillation signal FIN_OSCB, which are the output signals of the second delay cell 134, through its input terminals, and outputs signals synchronized with the positive main oscillation signal M_OSC. The second delay cell 134 receives the output signals of the first delay cell 132 through its input terminals, and outputs the positive final oscillation signal FIN_OSC and the negative final oscillation signal FIN_OSCB which are synchronized with the negative main oscillation signal M_OSCB.

FIG. 2 is a circuit diagram illustrating the injection locking oscillator 130 of FIG. 1. In FIG. 2, only the first delay cell 132 is illustrated for the convenience of description. Furthermore, the first delay cell 132 and the second delay cell 134 have similar configurations. The difference between the first delay cell 132 and the second delay cell 134 is that the first delay cell 132 includes an NMOS transistor NM having a gate receiving the positive main oscillation signal M_OSC, whereas the second delay cell 134 includes an NMOS transistor (not shown) having a gate receiving the negative main oscillation signal M_OSCB.

Referring to FIG. 2, the first delay cell 132 includes an input/output unit 210, a loading unit 230, and a current control unit 250.

The input/output unit 210 receives the negative final oscillation signal FIN_OSCB through a first input terminal IN, and receives the positive final oscillation signal FIN_OSC through a second input terminal INB. Furthermore, the input/output unit 210 outputs differential output signals through first and second output terminals OUT and OUTB in response in synchronization with the positive main oscillation signal M_OSC.

The loading unit 230 has a loading value corresponding to a first resistor R1 and a second resistor R2, wherein the loading value is a factor that determines the RC delay of a circuit.

The current control unit 250 includes the NMOS transistor NM having a drain connected to a common node N, a source connected to a ground voltage terminal VSS, and a gate receiving the positive main oscillation signal M_OSC. The current control unit 250 controls current flowing through a current path between the common node N and the ground voltage terminal VSS in response to the positive main oscillation signal M_OSC.

On the main oscillation signal and the final oscillation signal, the positive and negative final oscillation signals FIN_OSC and FIN_OSCB have a frequency obtained by dividing the frequency of the positive main oscillation signal M_OSC by 2. For example, if the positive main oscillation signal M_OSC has a frequency of 4 GHz, each of the positive final oscillation signal FIN_OSC and the negative final oscillation signal FIN_OSCB has a frequency of 2 GHz. At this point, the phenomenon that the output signals of the injection locking oscillator 130, i.e., the final oscillation signals, are synchronized with the main oscillation signals is referred to as an injection locking.

Since the injection locking is the general phenomenon of circuits adopting the injection locking scheme, its detailed description will be omitted.

Referring again to FIG. 1, the main oscillator 110 generates the positive main oscillation signal M_OSC and the negative main oscillation signal M_OSCB and injects the generated signals into the injection locking oscillator 130. In this case, the injection locking oscillator 130 outputs the positive/negative final oscillation signals FIN_OSC and FIN_OSCB having a frequency obtained by dividing the frequencies of the positive/negative main oscillation signals M_OSC and M_OSCB by 2 in accordance with the injection locking. Herein, the injection locking oscillator 130 is a divider that divides a frequency of an input signal by 2.

Meanwhile, the frequencies of the positive/negative main oscillation signals M_OSC and M_OSCB and the free running frequency of the injection locking oscillator 130 must satisfy a desired condition for the occurrence of the injection locking. The relationship between the frequencies of the positive/negative main oscillation signals M_OSC and M_OSCB and the free running frequency of the injection locking oscillator 130 will be described below.

In order for the occurrence of the injection locking, i.e., in order for exactly dividing the frequencies of the positive/negative main oscillation signals M_OSC and M_OSCB by 2, the free running frequency of the injection locking oscillator 130 must be placed at approximately half the frequencies of the positive/negative main oscillation signals M_OSC and M_OSCB. Otherwise, the injection locking does not occur in the injection locking oscillator 130 so that the frequencies of the positive/negative main oscillation signals M_OSC and M_OSCB are not correctly divided. This phenomenon often occurs in circuits to which the injection locking scheme using the circuit configuration of FIG. 2 is applied.

Herein, the frequency range of the positive/negative main oscillation signals M_OSC and M_OSCB in which the injection locking can occur is referred to as an injection locking range, and the injection locking range is about $\frac{1}{10}$ times the free running frequency of the injection locking oscillator 130.

Assuming that the frequencies of the positive/negative main oscillation signals M_OSC and M_OSCB intended to be finally output from the main oscillator 110 are 4 GHz and then the free running frequency of the injection locking oscillator 130 is fixedly to 2 GHz, the injection locking range is about 1/10 times the frequency of 2 GHz. Therefore, the injection locking can be achieved when the frequencies of the positive/negative main oscillation signals M_OSC and M_OSCB are placed within the frequency range from 3.9 GHz to 4.1 GHz. That is, the injection locking can occur in the injection locking oscillator 130 only when a free running frequency of the main oscillator 110 is placed within the frequency range from 3.9 GHz to 4.1 GHz. Furthermore, when the frequencies of the positive/negative main oscillation signals M_OSC and M_OSCB which are finally output from the main oscillator 110 is 4 GHz, the injection locking oscillator 130 exactly divide the frequencies of the positive/negative main oscillation signals M_OSC and M_OSCB by 2 to output the positive/negative final oscillation signals FIN_OSC and FIN_OSCB having the frequency of 2 GHz.

In other words, the range of the free running frequency of the main oscillator 110 is limited in accordance with the fixed free running frequency of the injection locking oscillator 130. This means that the operating frequency range of the main oscillator 110 capable of dividing the frequency by 2 is limited within the injection locking range.

Meanwhile, the DLL and the PLL, which are a clock synchronization circuit, include a divider. If the injection locking scheme is applied to the divider used in the PLL and the DLL, the PLL and the DLL can reduce power consumption and improve operation performance with respect to jitters. However, the divider using the injection locking scheme is difficult to design in the PLL and the DLL operating in a broad operating frequency range because of the following reasons.

If operating frequency ranges of signals which the VCO of the PLL or the VCDL of the DLL intends to output are in the range from 1 GHz to 5 GHz (the VDCL delays an input signal, but the frequency range of an output signal may be varied in accordance with the frequency of the input signal), the divider using the injection locking scheme must also divide all the frequencies of 1 GHz to 5 GHz. However, since the free running frequency of the divider using the injection locking scheme is fixed, most of the frequencies of 1 GHz to 5 GHz get out of the injection locking range. Accordingly, it is almost impossible to apply the injection locking scheme to the divider included in the PLL and the DLL.

Consequently, the injection locking scheme must limit the operating frequency range of the oscillation signal injected in the injection locking oscillator 130 to the injection locking range. Although the injection locking scheme can reduce power consumption and improve operation performance with respect to the jitter, it is almost impossible to apply the injection locking scheme to the clock synchronization circuit.

SUMMARY OF THE INVENTION

Embodiments of the present invention are directed to providing an injection locking clock generator which can vary the free running frequency of an injection locking oscillator to broaden an operating frequency range of an oscillation signal injected to itself, thereby performing an injection locking with respect to all frequencies of an operating frequency range.

Embodiments of the present invention are directed to providing a clock synchronization circuit such as a phase locked loop (PLL) and a delay locked loop (DLL) including a divider using an injection locking scheme.

In accordance with an aspect of the present invention, there is provided a clock generator, which includes a main oscillator configured to generate oscillation signals of a frequency corresponding to a control voltage, and an injection locking oscillator configured to generate division signals synchronized with the oscillation signals by dividing the oscillation signals, wherein a free running frequency of the injection locking oscillator is set according to the frequency of the oscillation signals.

In accordance with another aspect of the present invention, there is provided a phase locked loop, which includes a phase/frequency detector configured to detect a phase/frequency between a reference clock signal and a fed back division clock signal, a control voltage generator configured to generate a control voltage corresponding to an output signal of the phase/frequency detector, a voltage controlled oscillator configured to generate internal clock signals of a frequency corresponding to a voltage level of the control voltage, and an injection locking divider configured to generate the fed back division clock signal synchronized with the internal clock signals by dividing the internal clock signals, wherein a free running frequency of the injection locking divider is set according to a frequency of the internal clock signals.

In accordance with an aspect of the present invention, there is provided a delay locked loop, which includes a phase detector configured to detect a phase difference between a reference clock signal and a fed back division clock signal, a control voltage generator configured to generate a control voltage corresponding to an output signal of the phase detector, a voltage controlled delay line configured to reflect delay amount corresponding to a voltage level of the control voltage on the reference clock signal to output internal clock signals, a delay model configured to reflect a delay amount of an actual clock path on the internal clock signals to output delay locked clock signals, and an injection locking divider configured to generate the fed back division clock signal synchronized with the delay locked clock signals by dividing the delay locked clock signals, wherein a free running frequency of the injection locking divider is set according to the delay amount of the reference clock signal.

The clock generator in accordance with the present invention generates an oscillation signal with an operating frequency corresponding to the voltage level of a control voltage and set a free running frequency of an injection locking oscillator, to which the oscillation signal is injected, according to the control voltage, thereby enabling the injection locking oscillator to perform an injection locking according to all frequencies within the operating frequency range of the oscillation signal. Consequently, the present invention can reduce power consumption and improve operation performance with respect to jitters.

Furthermore, since a divider using an injection locking scheme in accordance with of the present invention can be applied to the clock synchronization circuit such as the PLL and the DLL, the power consumption of the clock synchronization circuit is reduced and operation performance with respect to jitters is improved. Moreover, the stable and efficient operation of a circuit can be ensured.

DESCRIPTION OF SPECIFIC EMBODIMENTS

Hereinafter, an injection locking clock generator and a clock synchronization circuit using the same in accordance with the present invention will be described in detail with reference to the accompanying drawings.

Figure 1:
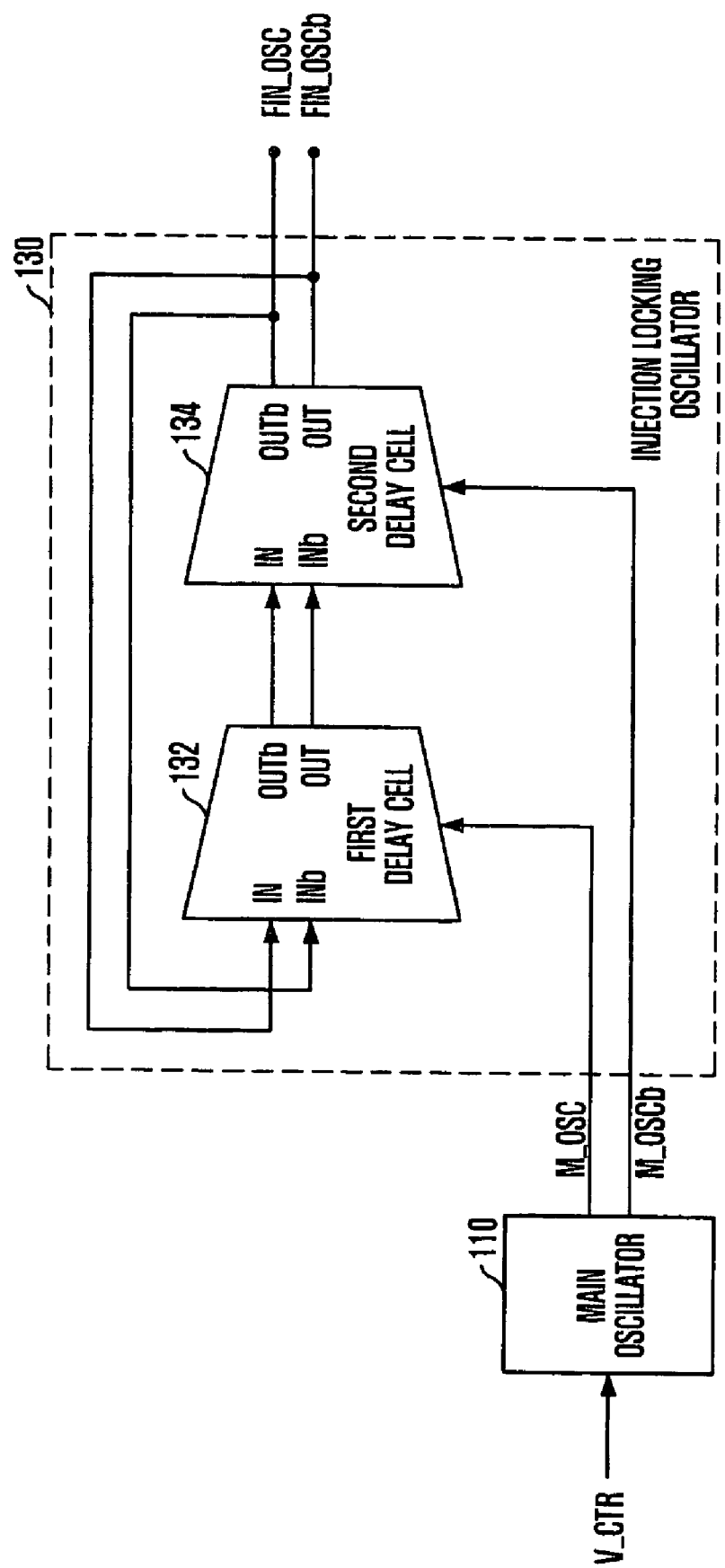
FIG. 1 is a block diagram of a clock generator using a general injection locking scheme.
Figure 2:
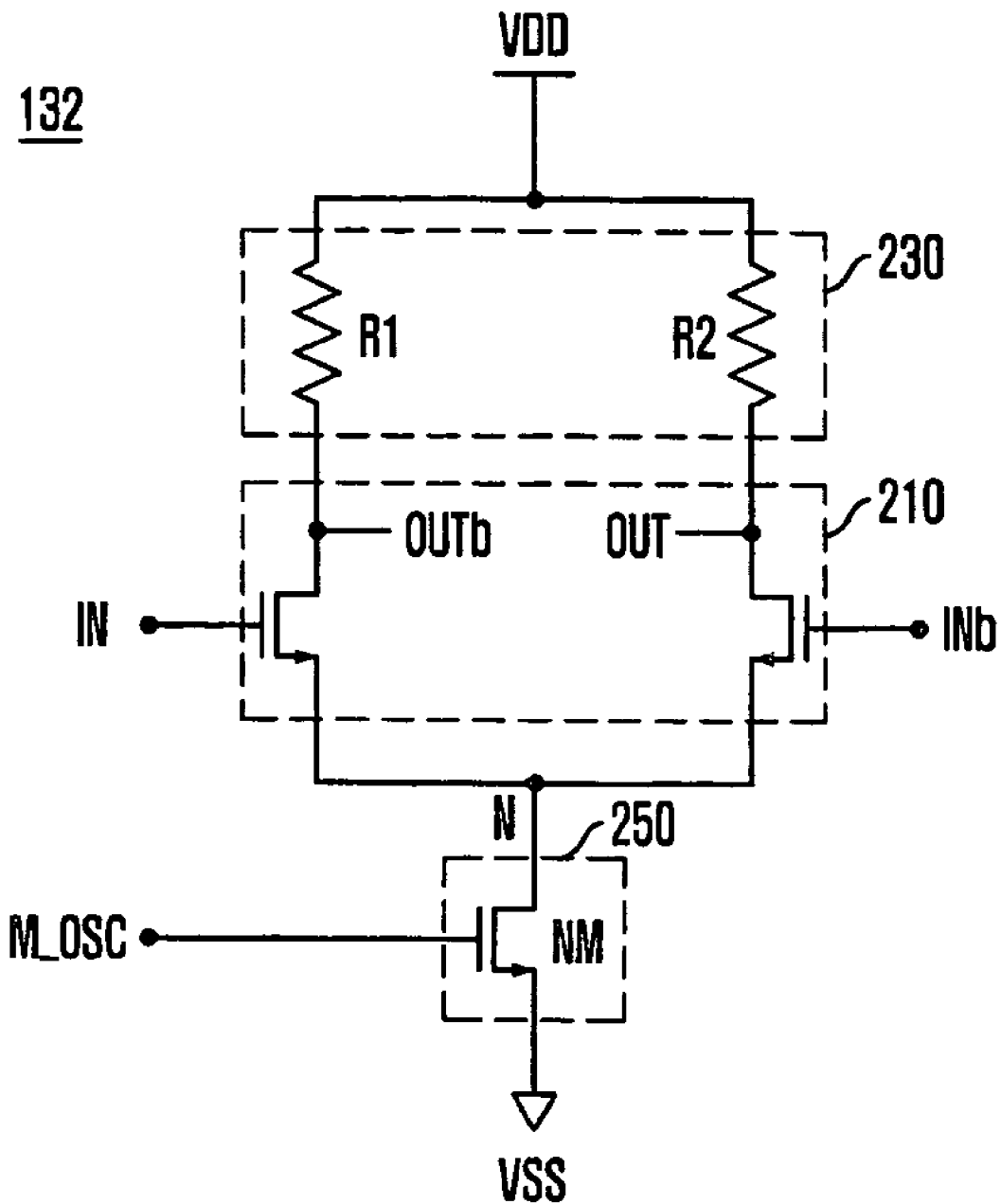
FIG. 2 is a circuit diagram illustrating an injection locking oscillator (130) of FIG. 1.
Figure 3:
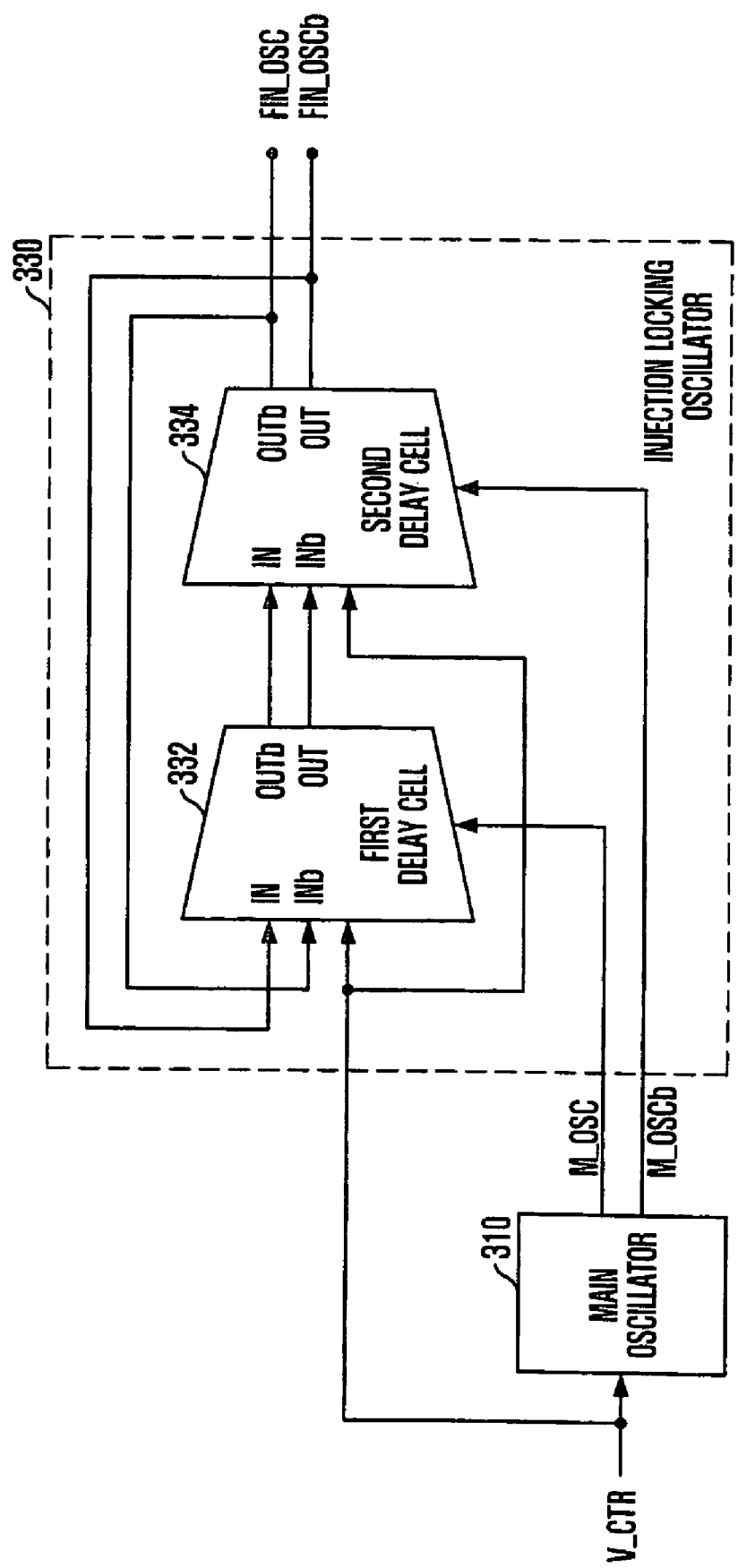
FIG. 3 is a block diagram of a clock generator using an injection locking scheme in accordance with an embodiment of the present invention.

FIG. 3 is a block diagram of a clock generator using an injection locking scheme in accordance with an embodiment of the present invention.

Referring to FIG. 3, the clock generator using the injection locking scheme includes a main oscillator 310 and an injection locking oscillator 330.

The main oscillator 310 generates a positive main oscillation signal M_OSC having a frequency corresponding to the voltage level of an input control voltage V_CTR and a negative main oscillation signal M_OSCB having a phase opposite to the phase of the positive main oscillation signal M_OSC. The main oscillator 310 may have an operating frequency range between a minimum frequency and a maximum frequency according to the voltage level of the control voltage V_CTR. Therefore, the main oscillator 310 generates the positive/negative main oscillation signals M_OSC and M_OSCB having a frequency corresponding to the control voltage V_CTR.

The injection locking oscillator 330 may be implemented as a ring oscillator including a first delay cell 332 and a second delay cell 334. The first delay cell 332 receives a positive final oscillation signal FIN_OSC and a negative final oscillation signal FIN_OSCB, which are the output signals of the second delay cell 334, through its input terminals IN and INB, and outputs output signals synchronized with the positive main oscillation signal M_OSC. The second delay cell 334 receives the output signals of the first delay cell 332 through its input terminals IN and INB, and outputs the positive final oscillation signal FIN_OSC and the negative final oscillation signal FIN_OSCB synchronized with the negative main oscillation signal M_OSCB.

The free running frequency of the injection locking oscillator 330 is set according to the control voltage V_CTR controlling the main oscillator 310, and an injection locking can be achieved with respect to all frequencies of the positive/negative main oscillation signals M_OSC and M_OSCB. That is, the clock generator using the injection locking scheme in accordance with the embodiment of the present invention varies the free running frequency of the injection locking oscillator 330 according to the control voltage V_CTR, and thus the injection locking can be achieved with respect to all frequencies within the operating frequency range of the main oscillator 310.

Figure 4:
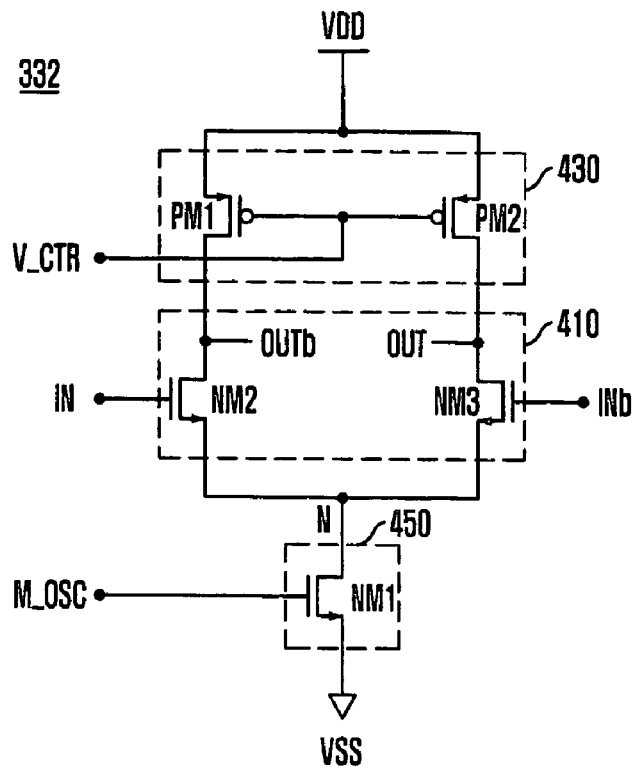
FIG. 4 is a circuit diagram illustrating an injection locking oscillator (330) of FIG. 3.

FIG. 4 is a circuit diagram illustrating the injection locking oscillator 330 of FIG. 3. In FIG. 4, the first delay cell 332 only is illustrated for the convenience of description. Furthermore, the first delay cell 332 and the second delay cell 334 have similar configurations. The difference of the first delay cell 332 and the second delay cell 334 is that the first delay cell 332 includes a first NMOS transistor NM1 having a gate receiving the positive main oscillation signal M_OSC, whereas the second delay cell 334 includes an NMOS transistor (not shown) having a gate receiving the negative main oscillation signal M_OSCB.

Referring to FIG. 4, the first delay cell 332 includes an input/output unit 410, a loading unit 430, and a current control unit 450.

The input/output unit 410 receives the positive/negative final oscillation signals FIN_OSC and FIN_OSCB, which are differentially input, through a first input terminal IN and a second input terminal INB, respectively. The input/output unit 410 outputs differential output signals through a first output terminal OUT and a second output terminal OUTB in synchronization with the positive main oscillation signal M_OSC. Furthermore, the input/output unit 410 may include a second NMOS transistor NM2 and a third NMOS transistor NM3. The second NMOS transistor NM2 has a drain connected to the second output terminal OUTB, a source connected to a common node N, and a gate receiving the negative final oscillation signal FIN_OSCB. The third NMOS transistor NM3 has a drain connected to the first output terminal OUT, a source connected to the common node N, and a gate receiving the positive final oscillation signal FIN_OSC.

The loading unit 430 provides a loading value in response to the control voltage V_CTR, and may include a first PMOS transistor PM1 and a second PMOS transistor PM2. The first PMOS transistor PM1 has a source connected to a power supply voltage terminal VDD, a drain connected to the second output terminal OUTB, and a gate receiving the control voltage V_CTR. The second PMOS transistor PM2 has a source connected to the power supply voltage terminal VDD, a drain connected to the first output terminal OUT, and a gate receiving the control voltage V_CTR. The first and second PMOS transistors PM1 and PM2 of the loading unit 430 have the loading value varying with the control voltage V_CTR, and the loading value is a factor that determines the RC delay and free running frequency of the injection locking oscillator 330.

The current control unit 450 controls current flowing through a current path between the common node N and the ground voltage terminal VSS in response to the positive main oscillation signal M_OSC. The current control unit 450 may include the first NMOS transistor NM1 having a drain connected to the common node N, a source connected to the ground voltage terminal VSS, and a gate receiving the positive main oscillation signal M_OSC.

According to the embodiment of the present invention, the loading unit 430 has the loading value varying with the voltage level of the control voltage V_CTR. As the voltage level of the control voltage V_CTR gradually falls, the loading value of the loading unit 430 becomes smaller. On the other hand, as the voltage level of the control voltage V_CTR gradually rises, the loading value of the loading unit 430 becomes higher. Using this phenomenon, the present invention may vary the free running frequency of the injection locking oscillator 330. That is, the free running frequency of the injection locking oscillator 330 increases when the loading value of the loading unit 430 decreases, and decreases when the loading value of the loading unit 430 increases.

The operation of the clock generator will be described below with reference to FIG. 3.

For the convenience of description, it is assumed that the main oscillator 310 generates the positive/negative main oscillation signals M_OSC and M_OSCB with a high frequency according to the control voltage V_CTR having the low voltage level, and generates the positive/negative main oscillation signals M_OSC and M_OSCB with a low frequency according to the control voltage V_CTR having the high voltage level. Moreover, it is assumed that a high free running frequency of the injection locking oscillator 330 is set according to the control voltage V_CTR with the low voltage level, and a low free running frequency of the injection locking oscillator 330 is set according to the control voltage V_CTR with the high voltage level. Furthermore, the relationship between the control voltage V_CTR and the frequencies of the positive/negative main oscillation signals M_OSC and M_OSCB may be varied depending on circuit design, and the relationship between the control voltage V_CTR and the free running frequency of the injection locking oscillator 330 may be varied depending on the circuit design.

When the control voltage V_CTR with the low voltage level is input, the main oscillator 310 outputs the positive/negative main oscillation signals M_OSC and M_OSCB with a high frequency corresponding to the control voltage V_CTR with the low voltage level, and the high free running frequency of the injection locking oscillator 330 is set corresponding to the control voltage V_CTR with the low voltage level. At this point, the set free running frequency satisfies the injection locking condition because it falls within the injection locking range.

When the control voltage V_CTR with the high voltage level is input, the main oscillator 310 outputs the positive/negative main oscillation signals M_OSC and M_OSCB with a low frequency corresponding to the control voltage V_CTR with the high voltage level, and the low free running frequency of the injection locking oscillator 330 is set corresponding to the control voltage V_CTR with the high voltage level. At this point, the set free running frequency also satisfies the injection locking condition because it falls within the injection locking range.

Then, when the positive/negative final oscillation signals FIN_OSC and FIN_OSCB of the injection locking oscillator 330 are synchronized with the positive/negative main oscillation signals M_OSC and M_OSCB, that is, when the injection locking occurs, the frequencies of the positive/negative final oscillation signals FIN_OSC and FIN_OSCB are equal to half the frequencies of the positive/negative main oscillation signal M_OSC and M_OSCB.

According to the embodiment of the present invention, the positive/negative main oscillation signals M_OSC and M_OSCB having a frequency corresponding to the voltage level of the control voltage V_CTR are generated and the free running frequency of the injection locking oscillator 330 to which the positive/negative main oscillation signals M_OSC and M_OSCB are injected is varied according to the control voltage V_CTR corresponding to the frequencies of the positive/negative main oscillation signals M_OSC and M_OSCB, and thus the injection locking oscillator 330 can perform frequency division on all output frequencies of the injected positive/negative main oscillation signals M_OSC and M_OSCB.

It is assumed that the frequency range of the positive/negative main oscillation signals M_OSC and M_OSCB which the main oscillator 310 intends to output is 1 GHz to 5 GHz.

The main oscillator 310, which has received the control voltage V_CTR corresponding to the frequency of 1 GHz, outputs the positive/negative main oscillation signals M_OSC and M_OSCB with the frequency of 1 GHz. At this point, the free running frequency of the injection locking oscillator 330 is set to about half the frequency of 1 GHz by the control voltage V_CTR. Since the injection locking condition is satisfied, the injection locking oscillator 330 outputs the positive/negative final oscillation signals FIN_OSC and FIN_OSCB with the frequency of 500 MHz.

Subsequently, the main oscillator 310, which has received the control voltage V_CTR corresponding to the frequency of 5 GHz, outputs the positive/negative main oscillation signals M_OSC and M_OSCB with the frequency of 5 GHz. At this point, the free running frequency of the injection locking oscillator 330 is set to about half the frequency of 5 GHz by the control voltage V_CTR. Since the injection locking condition is also satisfied, the positive/negative final oscillation signals FIN_OSC and FIN_OSCB can have the frequency of 2.5 GHz.

Although it has been described above that the intended output frequency of the main oscillator 310 is 1 GHz to 5 GHz, the injection locking condition can be satisfied with respect to all frequencies output from the main oscillator 310. This means that the free running frequency of the injection locking oscillator 330 may be varied at about half the free running frequency of the main oscillator 310 wherever the free running frequency of the main oscillator 310 is placed.

Figure 5:
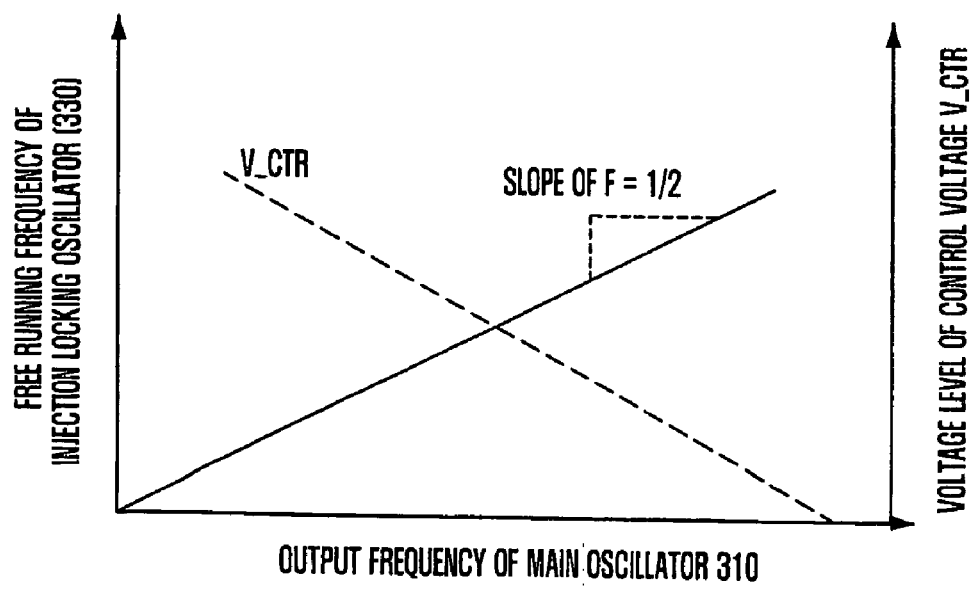
FIG. 5 is a graph of signals associated with operations of a main oscillator (310) and the injection locking oscillator (330) of FIG. 3.

FIG. 5 is a graph for explaining signals associated with operations of the main oscillator 310 and the injection locking oscillator 330 of FIG. 3.

Referring to FIG. 5, the output frequency of the main oscillator 310 is determined in accordance with the voltage level of the control voltage V_CTR, and the free running frequency of the injection locking oscillator 330 is also determined in accordance with the voltage level of the control voltage V_CTR. The slope of a function F associated with the output frequency of the main oscillator 310 and the free running frequency of the injection locking oscillator 330 may be ½. This means that the free running frequency of the injection locking oscillator 330 has half the output frequency of the main oscillator 310 according to the control voltage V_CTR when the output frequency of the main oscillator 310 is output according to the control voltage V_CTR. That is, the free running frequency of the injection oscillator 330 may be varied in accordance with the control voltage V_CTR, and such a variable free running frequency may always satisfy the injection locking range.

Meanwhile, since the operating frequency of the semiconductor device increases to frequency band above giga Hertz (GHz) due to the development of technologies, the clock synchronization circuit such as the PLL and the DLL is required to perform an operation for synchronizing the phase of an internal clock signal with that of an external clock signal, a filtering operation for improving operation performance with respect to jitters, and an operation for reducing power consumption. For the above-described reasons, the divider using the conventional injection locking scheme cannot be used in the clock synchronization circuit. However, the injection locking oscillator 330, i.e., a divider capable of dividing all frequencies of an injected oscillation signal by 2, may be included in the PLL or the DLL. The PLL and the DLL can improve operation performance with respect to jitters and reduce power consumption.

Figure 6:
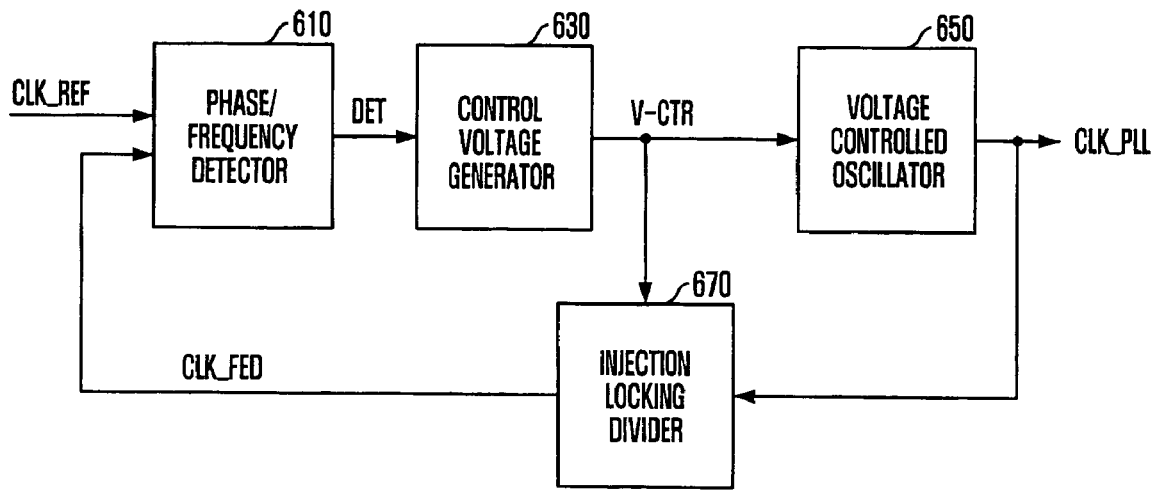
FIG. 6 is a block diagram of a phase locked loop (PLL) for using the injection locking oscillator (330) in accordance with an embodiment of the present invention.

FIG. 6 is a block diagram of a PLL for using the injection locking oscillator 330 as a divider in accordance with the present invention.

Referring to FIG. 6, the PLL may include a phase/frequency detector 610, a control voltage generator 630, a voltage controlled oscillator 650, and an injection locking divider 670. Since the phase/frequency detector 610, the control voltage generator 630, and the voltage controlled oscillator 650 are apparent to those skilled in the art, their detailed description will be omitted. Moreover, since the injection locking divider 670 has the same configuration as the injection locking generator 330, its detailed description will also be omitted.

The phase/frequency detector 610 detects a phase/frequency difference between a reference clock signal CLK_REF and a fed back division clock signal CLK_FED, and the control voltage generator 630 generates a control voltage V_CTR with a voltage level corresponding to the output signal DET of the phase/frequency detector 610. Herein, the control voltage V_CTR is used to set the free running frequency of the injection locking divider 670.

The voltage controlled oscillator 650 generates a PLL clock signal CLK_PLL corresponding to the voltage level of the control voltage V_CTR. Herein, the PLL clock signal CLK_PLL is injected to the injection locking divider 670.

The injection locking divider 670 generates a division clock signal, i.e., the fed back division clock signal CLK_FED, synchronized with the PLL clock signal CLK_PLL and generated by dividing the PLL clock signal CLK_PLL. Herein, the control voltage V_CTR setting the free running frequency of the injection locking divider 670 may be any signal corresponding to the operating frequency of the PLL clock signal CLK_PLL.

Because the free running frequency of the divider using the conventional injection locking scheme is fixed, the injection locking hardly occurs in the range of the injected oscillation signal, i.e., the PLL clock signal CLK_PLL which must have a broad frequency range. However, the divider using the injection locking scheme in accordance with the embodiment of the present invention, i.e., the injection locking divider 670 can satisfy the condition that the injection locking can occur in the entire frequency range of the injected PLL clock signal CLK_PLL because the free running frequency can be varied within the injection locking range in accordance with the control voltage V_CTR.

Figure 7:
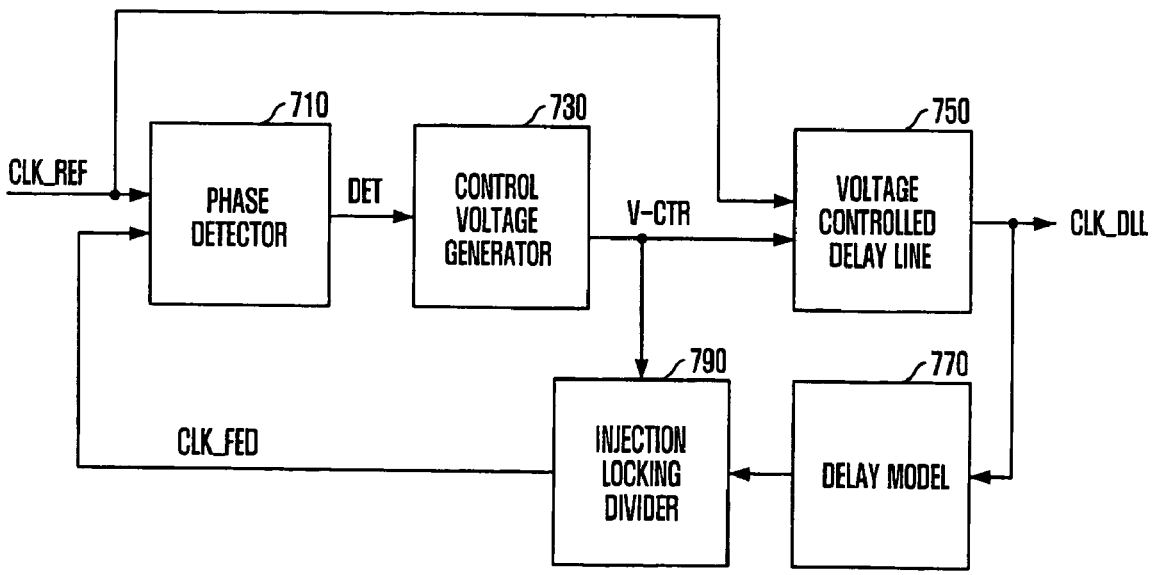
FIG. 7 is a block diagram of a delay locked loop (DLL) for using the injection locking oscillator (330) in accordance with an embodiment of the present invention.

FIG. 7 is a block diagram of a DLL for using the injection locking oscillator 330 as a divider in accordance with an embodiment of the present invention.

Referring to FIG. 7, the DLL may include a phase detector 710, a control voltage generator 730, a voltage controlled delay line 750, a delay model 770, and an injection locking divider 790. Since the phase detector 710, the control voltage generator 730, the voltage controlled delay line 750, and the delay model 770 are apparent to those skilled in the art, their detailed description will be omitted. Moreover, since the injection locking divider 790 has the same configuration as the injection locking oscillator 330, it detailed description will also be omitted.

The phase detector 710 detects a phase/frequency difference between a reference clock signal CLK_REF and a fed back division clock signal CLK_FED, and the control voltage generator 730 generates a control voltage V_CTR with a voltage level corresponding to the output signal DET of the phase detector 710. Herein, the control voltage V_CTR is used to set the free running frequency of the injection locking divider 790.

The voltage controlled delay line 750 delays the reference clock signal CLK_REF by a delay amount corresponding to the voltage level of the control voltage V_CTR to output a delay lock loop (DLL) clock signal CLK_DLL, and the delay model 770 reflects the delay of an actual clock path on the DLL clock signal CLK_DLL.

The injection locking divider 790 can divide the reflected DLL clock signal to generate a division clock signal, i.e., the fed back division clock signal CLK_FED synchronized with the reflected DLL clock signal. Herein, the control voltage V_CTR setting the free running frequency of the injection locking divider 790 may be any signal corresponding to the delay amount of the reference clock signal CLK_REF.

The divider using the injection locking scheme of the DLL, i.e., the injection locking divider 790, can satisfy the condition that the injection locking can occur in all the frequency range of the injected DLL clock signal CLK_DLL because the free running frequency of the injection locking divider 790 can be varied within the injection locking range in accordance with the control voltage V_CTR.

Although the output signal of the delay model 770 is injected to the injection locking divider 790, the DLL clock signal CLK_DLL can also be directly injected to the injection locking divider 790. That is, the DLL may be designed such that the delay model 770 receives the output signal of the injection locking divider 790. In this case, the delay model 770 receives the output signal of the injection locking divider 790 and outputs the fed back division clock signal CLK_FED to the phase detector 710. At this point, the delay model 770 and the injection locking divider 790 may be provided between the output terminal of the voltage controlled delay line 750 and the input terminal of the phase detector 710 receiving the fed back division clock signal CLK_FED, wherein the input order of the DLL clock signal CLK_DLL may be changed.

As described above, the clock generator in accordance with the embodiment of the present invention generates the oscillation signal with a frequency corresponding to the voltage level of the control voltage V_CTR and sets the free running frequency of the injection locking oscillator 330 receiving the oscillation signal in response to the control voltage V_CTR, and thus the injection locking oscillator 330 can divide all frequencies within the operating frequency range of the oscillation signal. Consequently, the present invention may reduce power consumption caused by the injection locking scheme and improve operation performance with respect to jitters.

Furthermore, the divider using the injection locking scheme can be applied to the clock synchronization circuit such as the PLL and the DLL, and thus the present invention can reduce power consumption caused by the injection locking scheme and improve operation performance with respect to jitters. Moreover, the improvement in operation performance with respect to jitters can secure the stable and exact operation of the clock synchronization circuit.

The present invention can obtain an effect that can reduce power consumption in a circuit to which the injection locking scheme is applied, improve operation performance with respect to jitters, and perform the injection locking according to all the operating frequency range of the injected oscillation signal. Moreover, in the clock synchronization circuit using the injection locking scheme, the present invention can obtain an effect that can have a broad operating frequency range, reduce power consumption, improve operation performance with respect to jitters, and secure more stable and efficient circuit operation.

While the present invention has been described with respect to the specific embodiments, it will be apparent to those skilled in the art that various changes and modifications may be made without departing from the spirit and scope of the invention as defined in the following claims.

For example, in the above-described embodiments, the locations and kinds of the logic gates and transistors may be differently implemented in accordance with the polarities of the input signals.

Moreover, although the above-described embodiments give an example that the divider using the injection locking scheme divides an input frequency by 2, the present invention can also be applied to other embodiments that the divider divides a frequency by $2^n$ (where n is natural number) such as $2^2$ and $2^4$.

What is claimed is:

1. A clock generator, comprising:
a main oscillator configured to generate oscillation signals of a frequency corresponding to a control voltage; and
an injection locking oscillator configured to generate division signals synchronized with the oscillation signals by dividing the oscillation signals, wherein a free running frequency of the injection locking oscillator is set according to the control voltage corresponding to the frequency of the oscillation signals,
wherein the injection locking oscillator includes:
a first delay cell configured to receive the division signals, and output signals in response to the control voltage and a first signal of the oscillation signals; and
a second delay cell configured to receive output signals of the first delay cell, and output the division signals in response to the control voltage and a second signal of the oscillation signals, and
wherein each of the first and second delay cells includes:
an input/output unit configured to receive differential input signals, and output differential output signals;
a loading unit connected between a power supply voltage terminal and the input/output unit and configured to have a loading value corresponding to the control voltage; and
a current control unit connected between the input/output unit and a ground voltage terminal, and configured to control current flowing through a current path in response to the oscillation signals.

2. The clock generator as recited in claim 1, wherein the injection locking oscillator divides the frequency of the oscillation signals by $2^n$, where n is natural number.

3. A phase locked loop, comprising:
a phase/frequency detector configured to detect a phase/frequency between a reference clock signal and a fed back division clock signal;
a control voltage generator configured to generate a control voltage corresponding to an output signal of the phase/frequency detector;
a voltage controlled oscillator configured to generate internal clock signals of a frequency corresponding to a voltage level of the control voltage; and
an injection locking divider configured to generate the fed back division clock signal synchronized with the internal clock signals by dividing the internal clock signals, wherein a free running frequency of the injection locking divider is set according to the control voltage corresponding to a frequency of the internal clock signals,
wherein the injection locking divider includes:
a first dela cell configured to receive the fed back division clock signal, and output a signal in response to the control voltage and a first signal of the internal clock signals; and
a second delay cell configured to receive an output signal of the first delay cell, and output the fed back division clock signal in response to the control voltage and a second signal of the internal clock signals, and
wherein each of the first and second delay cells includes:
an input/output unit configured to receive differential input signals, and output differential output signals;
a loading unit connected between a power supply voltage terminal and the input/output unit and configured to have a loading value corresponding to the control voltage; and
a current control unit connected between the input/output unit and a ground voltage terminal and configured to control current flowing through a current path in response to the internal signals.

4. The phase locked loop as recited in claim 3, wherein the injection locking divider divides the frequency of the internal clock signals by $2^n$, where n is natural number.

5. A delay locked loop, comprising:
a phase detector configured to detect a phase difference between a reference clock signal and a fed back division clock signal;
a control voltage generator configured to generate a control voltage corresponding to an output signal of the phase detector;
a voltage controlled delay line configured to reflect a delay amount corresponding to a voltage level of the control voltage on the reference clock signal to output internal clock signals;
a delay model configured to reflect a delay amount of an actual clock path on the internal clock signals to output delay locked clock signals; and
an injection locking divider configured to generate the fed back division clock signal synchronized with the delay locked clock signals by dividing the delay locked clock signals, wherein a free running frequency of the injection locking divider is set according to the delay amount of the reference clock signal.

6. The delay locked loop as recited in claim 5, wherein the free running frequency is set according to the control voltage corresponding to the delay amount of the reference clock signal.

7. The delay locked loop as recited in claim 6, wherein the injection locking divider includes:
a first delay cell configured to receive the fed back division clock signal, and output a signal in response to the control voltage and a first signal of the delay locked clock signals; and
a second delay cell configured to receive an output signal of the first delay cell, and output the fed back division clock signal in response to the control voltage and a second signal of the delay clocked clock signals.

8. The delay locked loop as recited in claim 7, wherein each of the first and second delay cells includes:

an input/output unit configured to receive differential input signals, and output differential output signals;

a loading unit connected between a power supply voltage terminal and the input/output unit and configured to have a loading value corresponding to the control voltage; and a current control unit connected between the input/output unit and a ground voltage terminal and configured to control current flowing through a current path in response to the delay locked clock signals.

9. The delay locked loop as recited in claim 5, wherein the injection locking divider divides the frequency of the delay locked clock signals by $2^n$, where n is natural number.

* * * * *